US011031552B2

(12) United States Patent
Rose et al.

(10) Patent No.: US 11,031,552 B2
(45) Date of Patent: Jun. 8, 2021

(54) PCM RF SWITCH WITH PCM CONTACTS HAVING SLOT LOWER PORTIONS

(71) Applicant: Newport Fab, LLC, Newport Beach, CA (US)

(72) Inventors: Jefferson E. Rose, Hawthorne, CA (US); Gregory P. Slovin, Irvine, CA (US); Nabil El-Hinnawy, Irvine, CA (US); Michael J. DeBar, Tustin, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 48 days.

(21) Appl. No.: 16/677,450

(22) Filed: Nov. 7, 2019

(65) Prior Publication Data

US 2020/0091424 A1    Mar. 19, 2020

Related U.S. Application Data

(60) Division of application No. 16/185,620, filed on Nov. 9, 2018, now Pat. No. 10,615,338, which is a
(Continued)

(51) Int. Cl.
*H01L 21/00* (2006.01)
*H01L 45/00* (2006.01)

(52) U.S. Cl.
CPC ......... *H01L 45/1246* (2013.01); *H01L 45/06* (2013.01); *H01L 45/126* (2013.01);
(Continued)

(58) Field of Classification Search
CPC . H01L 45/1246; H01L 45/06; H01L 45/1233; H01L 45/126; H01L 45/143; H01L 45/144; H01L 45/1675
See application file for complete search history.

(56) References Cited

U.S. PATENT DOCUMENTS 6,535,545 B1    3/2003  Ben-Bassat
7,761,067 B1    7/2010  Tsai et al.
(Continued)

FOREIGN PATENT DOCUMENTS

WO    WO 2016/028362    2/2016

OTHER PUBLICATIONS

Moon, et al. "Phase-Change RF Switches with Robust Switching Cycle Endurance," *2018 IEEE Radio and Wireless Symposium (RWS)*, pp. 231-233, Jan. 2018, Anaheim, CA.
(Continued)

*Primary Examiner* — Richard A Booth
(74) *Attorney, Agent, or Firm* — Farjami & Farjami LLP (57) ABSTRACT

In fabricating a radio frequency (RF) switch, a phase-change material (PCM) and a heating element underlying an active segment of the PCM are provided. A contact uniformity support layer is formed over the PCM. The PCM and the contact uniformity support layer are patterned. A contact dielectric is formed over the contact uniformity support layer. Slot lower portions of PCM contacts are formed extending through the contact dielectric and through the contact uniformity support layer, and connected to passive segments of the PCM. Wide upper portions of the PCM contacts are formed over the contact dielectric and over the slot lower portions of the PCM contacts. The contact dielectric separates the wide upper portions of the PCM contacts from the heating element so as to reduce parasitic capacitance of the RF switch. The contact uniformity support layer maintains a substantially constant thickness of the passive segments of the PCM.

20 Claims, 6 Drawing Sheets

Related U.S. Application Data continuation-in-part of application No. 16/114,106, filed on Aug. 27, 2018, now Pat. No. 10,707,125, and a continuation-in-part of application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993.

(52) U.S. Cl.
CPC ........ *H01L 45/1233* (2013.01); *H01L 45/143* (2013.01); *H01L 45/144* (2013.01); *H01L 45/1675* (2013.01)

(56) References Cited

U.S. PATENT DOCUMENTS

| | | |
|---|---|---|
| 2,014,181 A1 | 7/2014 | Moon |
| 9,257,647 B2 | 2/2016 | Borodulin |
| 9,362,492 B2 | 6/2016 | Goktepeli |
| 9,368,720 B1 | 6/2016 | Moon |
| 9,444,430 B1 | 9/2016 | Abdo |
| 9,601,545 B1 | 3/2017 | Tu |
| 9,917,104 B1 | 3/2018 | Roizin |
| 10,128,243 B2 | 11/2018 | Yoo |
| 10,164,608 B2 | 12/2018 | Belot |
| 10,461,253 B1 | 10/2019 | Slovin |
| 10,505,106 B1 | 12/2019 | Joshi |
| 10,529,922 B1 | 1/2020 | Howard |
| 2004/0113232 A1 | 6/2004 | Johnson et al. |
| 2005/0212090 A1 | 9/2005 | Friedrich et al. |
| 2007/0246766 A1 | 10/2007 | Liu |
| 2008/0142775 A1 | 6/2008 | Chen |
| 2008/0142777 A1 | 6/2008 | Park |
| 2008/0272355 A1 | 11/2008 | Cho |
| 2008/0291718 A1 | 11/2008 | Liu |
| 2009/0065761 A1 | 3/2009 | Chen |
| 2009/0115052 A1 | 5/2009 | Treece et al. |
| 2010/0238603 A1 | 9/2010 | Chung |
| 2010/0246247 A1 | 9/2010 | Kim |
| 2011/0097825 A1 | 4/2011 | Cheng |
| 2011/0291784 A1 | 12/2011 | Nakatsuji |
| 2012/0037872 A1 | 2/2012 | Ikarashi |
| 2014/0110657 A1 | 4/2014 | Redaelli |
| 2014/0191181 A1 | 7/2014 | Moon |
| 2014/0339610 A1 | 11/2014 | Rashed |
| 2015/0048424 A1 | 2/2015 | Tien |
| 2015/0104921 A1 | 4/2015 | Terai et al. |
| 2015/0333131 A1 | 11/2015 | Mojumder |
| 2016/0056373 A1 | 2/2016 | Goktepeli |
| 2017/0126205 A1 | 5/2017 | Lin |
| 2017/0187347 A1 | 6/2017 | Rinaldi |
| 2017/0207764 A1 | 7/2017 | Wang |
| 2017/0243861 A1 | 8/2017 | Wang |
| 2018/0005786 A1 | 1/2018 | Navarro |
| 2018/0138894 A1 | 5/2018 | Belot |
| 2018/0266974 A1 | 9/2018 | Khosravani |
| 2019/0088721 A1 | 3/2019 | Reig |
| 2019/0165264 A1 | 5/2019 | Wu |
| 2019/0267214 A1 | 8/2019 | Liu |
| 2019/0296718 A1 | 9/2019 | Birkbeck et al. |

OTHER PUBLICATIONS

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

G. Slovin, et al. "AlN Barriers for Capacitance Reduction in Phase-Change RF Switches," in *IEEE Electron Device Letters*, vol. 37, No. 5, pp. 568-571, May 2016.

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

Provide Phase-Change Material

FIG. 3

Form Contact Uniformity Support Layer

FIG. 4

Pattern Phase-Change Material

FIG. 5

Deposit Contact Interconnect Dielectric

FIG. 6

Planarize Contact Interconnect Dielectric

FIG. 7

Etch Holes

FIG. 8

Punch-Through

FIG. 9

Form Slot Lower Portions

FIG. 10

Form Wide Upper Portions

PCM RF SWITCH WITH PCM CONTACTS HAVING SLOT LOWER PORTIONS

CLAIMS OF PRIORITY

This is a divisional of application Ser. No. 16/185,620 filed on Nov. 9, 2018. Application Ser. No. 16/185,620 filed on Nov. 9, 2018 ("the parent application") is a continuation-in-part of and claims the benefit of and priority to application Ser. No. 16/103,490 filed on Aug. 14, 2018, titled "Manufacturing RF Switch Based on Phase-Change Material". The parent application is also a continuation-in-part of and claims the benefit of and priority to application Ser. No. 16/103,587 filed on Aug. 14, 2018, titled "Design for High Reliability RF Switch Based on Phase-Change Material". The parent application is also a continuation-in-part of and claims the benefit of and priority to application Ser. No. 16/103,646 filed on Aug. 14, 2018, titled "PCM RF Switch Fabrication with Subtractively Formed Heater". The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element". The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

Heating elements in PCM RF switches often contribute to parasitics, such as parasitic capacitors, associated with RF frequencies and result in performance tradeoffs. Additionally, the performance of an RF switch using PCM depends heavily on how contacts to the PCM are made. Fabricating contacts to the PCM without significant RF performance tradeoffs becomes complex, especially where the RF switch is designed primarily around thermal performance. Fabrication techniques applicable to conventional semiconductor devices may not be suitable for fabricating PCM RF switches. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art to reliably manufacture PCM RF switches having low parasitics and improved thermal performance.

SUMMARY

The present disclosure is directed to phase-change material (PCM) contacts with slot lower portions and contact dielectric for reducing parasitic capacitance and improving manufacturability in PCM RF switches, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
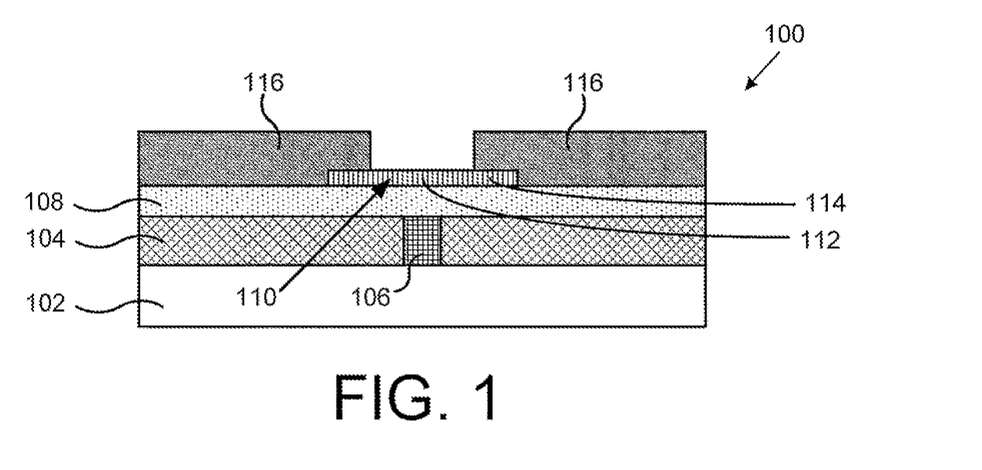
FIG. 1 illustrates a cross-sectional view of a portion of a phase-change material (PCM) radio frequency (RF) switch structure.

FIG. 1 illustrates a cross-sectional view of a portion of a phase-change material (PCM) radio frequency (RF) switch structure. As shown in FIG. 1, PCM RF switch structure 100 includes substrate 102, lower dielectric 104, heating element 106, thermally conductive and electrically insulating layer 108, PCM 110 having active segment 112 and passive segments 114, and PCM contacts 116.

Substrate 102 is situated under lower dielectric 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 102, or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (IPDs) (not shown in FIG. 1).

Lower dielectric 104 in PCM RF switch structure 100 is situated on top of substrate 102. As shown in FIG. 1, lower dielectric 104 is also adjacent to sides of heating element 106. Lower dielectric 104 may comprise a material with thermal conductivity lower than that of thermally conductive and electrically insulating layer 108. In various implementations, lower dielectric 104 can comprise silicon oxide ($SiO_2$), silicon nitride (SiN), or another dielectric.

Heating element 106 in PCM RF switch structure 100 is situated in lower dielectric 104. Heating element 106 also underlies active segment 112 of PCM 110. Heating element 106 generates a crystallizing heat pulse or an amorphizing heat pulse for transforming active segment 112 of PCM 110. Heating element 106 can comprise any material capable of Joule heating. Heating element 106 can be connected to electrodes of a current source (not shown in FIG. 1) that generates a crystallizing current pulse or an amorphizing current pulse. Preferably, heating element 106 comprises a material that exhibits minimal electromigration or substantially no electromigration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Thermally conductive and electrically insulating layer 108 in PCM RF switch structure 100 is situated on top of heating element 106 and lower dielectric 104, and under PCM 110 and, in particular, under active segment 112 of PCM 110. Thermally conductive and electrically insulating layer 108 ensures efficient heat transfer from heating element 106 toward active segment 112 of PCM 110, while impeding electrical signals from leaking out from PCM contacts 116 to heating element 106 or to other neighboring structures. Thermally conductive and electrically insulating layer 108 can comprise any material with high thermal conductivity and high electrical resistivity. In various implementations, thermally conductive and electrically insulating layer 108 can comprise aluminum nitride (AlN), aluminum oxide ($Al_XO_Y$), beryllium oxide ($Be_XO_Y$), silicon carbide (SiC), diamond, or diamond-like carbon.

PCM 110 in PCM RF switch structure 100 is situated on top of thermally conductive and electrically insulating layer 108. PCM 110 includes active segment 112 and passive segments 114. Active segment 112 of PCM 110 approximately overlies heating element 106 and is approximately defined by heating element 106. Passive segments 114 of PCM 110 extend outward and are transverse to heating element 106, and are situated approximately under PCM contacts 116. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state). With proper heat pulses and heat dissipation, active segment 112 of PCM 110 can transform between crystalline and amorphous phases, allowing a PCM RF switch to switch between ON and OFF states respectively.

PCM 110 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 110 can be germanium telluride having from forty percent to sixty percent germanium by composition (i.e., $Ge_XTe_Y$, where $0.4 \leq X \leq 0.6$ and $Y=1-X$). The material for PCM 110 can be chosen based upon ON state resistivity, OFF state electric field breakdown voltage, crystallization temperature, melting temperature, or other considerations. It is noted that in FIG. 1, current flowing in heating element 106 flows substantially under active segment 112 of PCM 110.

PCM contacts 116 in PCM RF switch structure 100 are situated on top of passive segments 114 of PCM 110 and thermally conductive and electrically insulating layer 108, and on sidewalls of PCM 110. PCM contacts 116 provide RF signals to and from PCM 110. In various implementations, PCM contacts 116 can comprise tungsten (W), copper (Cu), or aluminum (Al).

In semiconductor structures, contacts are often formed by selectively etching through a dielectric, such as $SiO_2$ and stopping at a semiconductor, such as Si. However, this approach is generally inapplicable to PCM structures because PCM is not conducive to selective etching. PCM contacts 116 in PCM RF switch structure 100 in FIG. 1 have been formed by using a lift-off manufacturing process. For example, the lift-off manufacturing process may comprise actions such as patterning PCM 110, masking active segment 112 of PCM 110 with photoresist, evaporating metal to form PCM contacts 116, and removing the photoresist mask, resulting in PCM RF switch structure 100. Thus, PCM contacts 116 may be formed despite the fact that PCM 110 is not conducive to selective etching.

Although the process of formation of PCM contacts 116 in PCM RF switch structure 100 is somewhat simplified, PCM 110 is exposed to atmospheric effects, such as oxidation and humidity, during the formation of PCM contacts 116. The longer PCM 110 is exposed to atmospheric effects, the more likely PCM 110 is to become damaged. Also, because PCM contacts 116 in PCM RF switch structure 100 are situated both on top of PCM 110 and on sidewalls of PCM 110, PCM contacts 116 perform as heat sinks for PCM 110. When PCM contacts 116 sink heat from PCM 110, more heat is required from heating element 106 in order to transform active segment 112 of PCM 110, and thus higher power is required to switch between ON and OFF states. Further, PCM contacts 116 in PCM RF switch structure 100 have wide bottom surface areas situated on thermally conductive and electrically insulating layer 108. These wide bottom surface areas of PCM contacts 116 form relatively large parasitic capacitors with heating element 106, and with substrate 102 when substrate 102 includes a heat spreader, IPDs, and/or semiconductive material (not shown in FIG. 1A), and increase the total parasitic capacitance of PCM RF switch structure 100.

Figure 2:
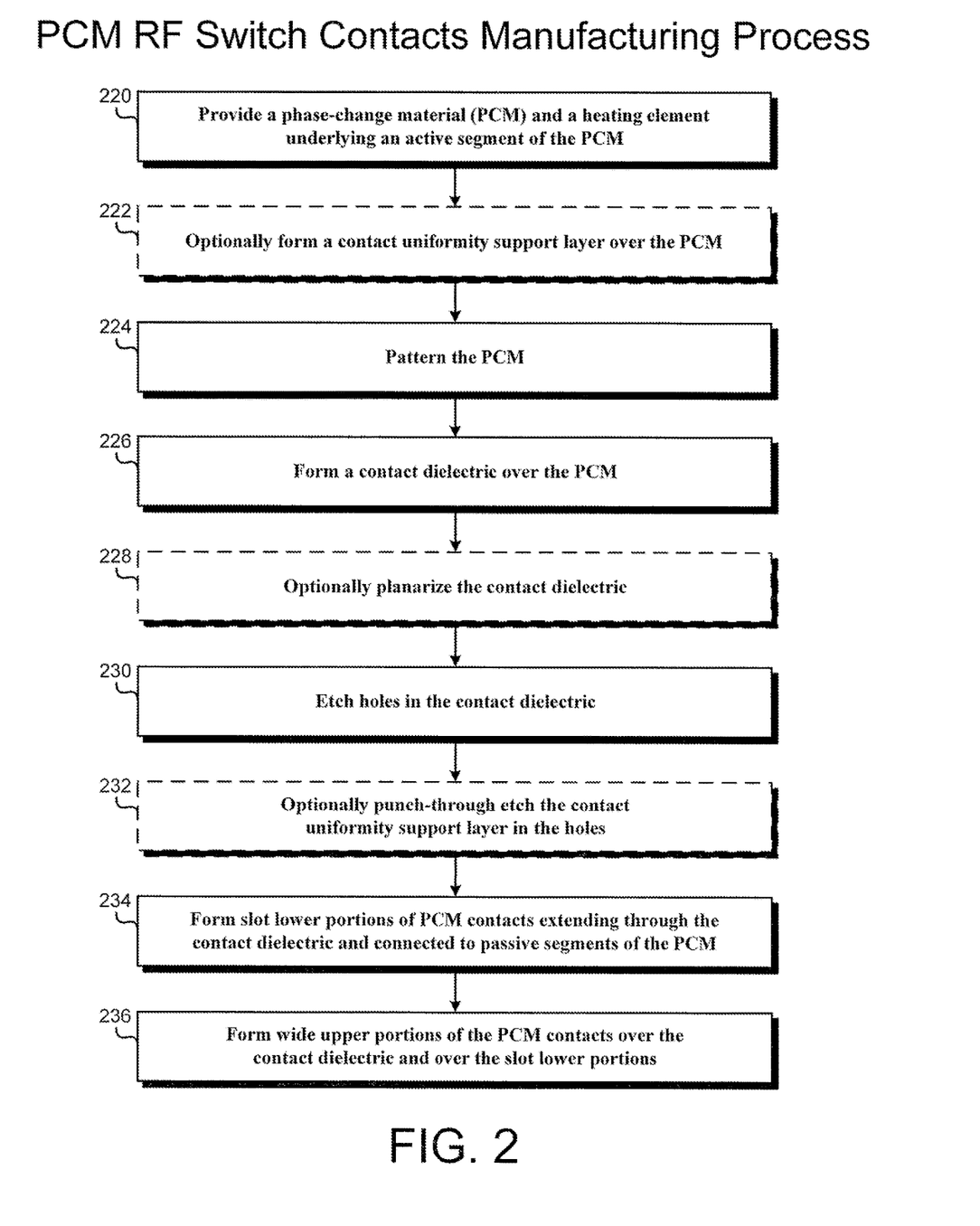
FIG. 2 illustrates a portion of a flowchart of an exemplary method for manufacturing PCM contacts with slot lower portions and wide upper portions in a PCM RF switch according to one implementation of the present application.

FIG. 2 illustrates a portion of a flowchart of an exemplary method for manufacturing contacts in a PCM RF switch according to one implementation of the present application. Certain details and features have been left out of the flowchart that are apparent to a person of ordinary skill in the art. For example, an action may consist of one or more subactions or may involve specialized equipment or materials, as known in the art. Moreover, some actions, such as masking and cleaning actions, are omitted so as not to distract from the illustrated actions. Actions shown with dashed lines are considered optional. Actions 220 through 236 shown in the flowchart of FIG. 2 are sufficient to describe one implementation of the present inventive concepts, other implementations of the present inventive concepts may utilize actions different from those shown in the flowchart of FIG. 2. Moreover, structures shown in FIGS. 3 through 11 illustrate the results of performing respective actions 220 through 236 in the flowchart of FIG. 2, respectively. For example, structure 120 shows a PCM RF switch structure after performing action 220, structure 122 shows a PCM RF switch structure after performing action 222, and so forth.

Figure 3:
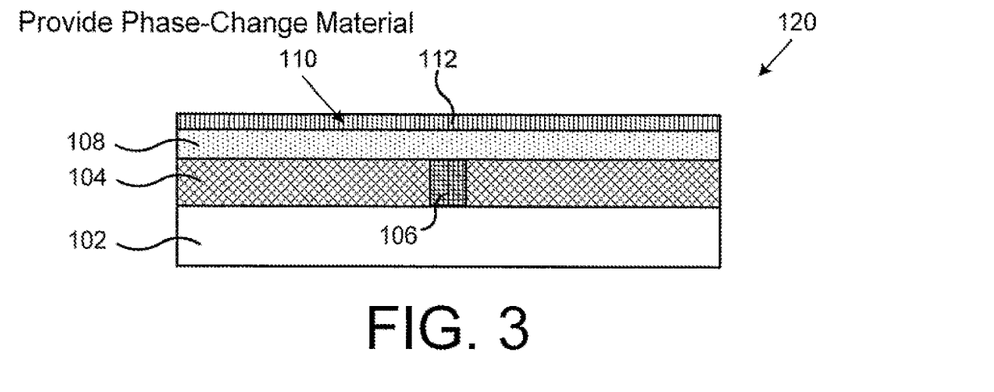
FIGS. 3 through 11 each illustrate a cross-sectional view of a portion of a PCM RF switch structure processed in accordance with respective actions in the flowchart of FIG. 2 according to one implementation of the present application.

Referring to FIG. 3, PCM RF switch structure 120 illustrates a cross-sectional view of a portion of a PCM RF switch structure processed in accordance with action 220 in the flowchart of FIG. 2 according to one implementation of the present application. As shown in FIG. 3, PCM RF switch structure 120 includes substrate 102, lower dielectric 104, heating element 106, thermally conductive and electrically insulating layer 108, and PCM 110. Substrate 102, lower dielectric 104, heating element 106, thermally conductive and electrically insulating layer 108, and PCM 110 in PCM RF switch structure 120 in FIG. 3 are similar to corresponding structures in PCM RF switch structure 100 in FIG. 1, and may have any implementations and advantages described above. PCM RF switch structure 120 may include other structures not shown in FIG. 3.

In PCM RF switch structure 120 of FIG. 3, PCM 110 can be provided, for example, by physical vapor deposition (PVD) sputtering, chemical vapor deposition (CVD), evaporation, or atomic layer deposition (ALD). In one implementation, PCM 110 can have a thickness of approximately five hundred angstroms to approximately two thousand angstroms (500 Å-2000 Å). In other implementations, PCM 110 can have any other thicknesses. The thickness of PCM 110 can be chosen based upon sheet resistance, crystallization power, amorphization power, or other considerations. Further shown in FIG. 3, thermally conductive and electrically insulating layer 108 is situated between heating element 106 and PCM 110, whereby heating element 106 underlies active segment 112 of PCM 110.

Figure 4:
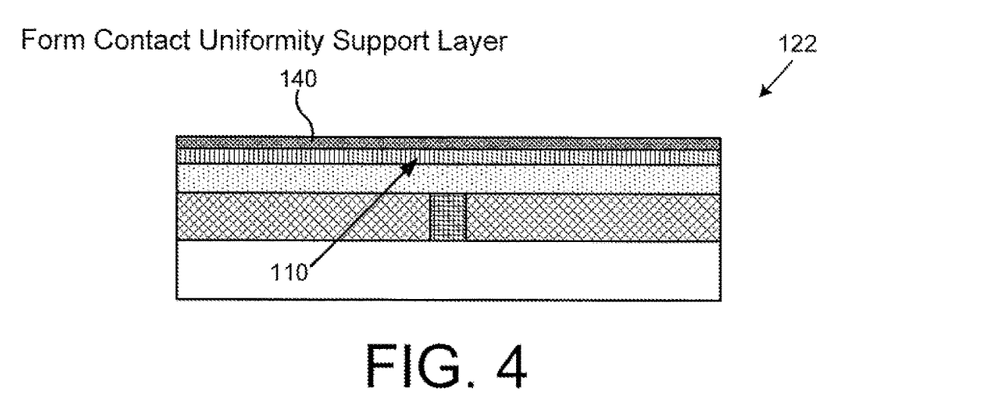

Referring to FIG. 4, PCM RF switch structure 122 illustrates a cross-sectional view of a portion of a PCM RF switch structure processed in accordance with action 222 in the flowchart of FIG. 2 according to one implementation of the present application. As shown in FIG. 4, contact uniformity support layer 140 is formed over PCM 110. In one implementation, contact uniformity support layer 140 comprises silicon nitride, i.e. $Si_XN_Y$. In another implementation contact uniformity support layer 140 is a bi-layer that comprises oxide and nitride, such as $SiO_2$ under $Si_XN_Y$. Contact uniformity support layer 140 can be deposited, for example, by plasma enhanced CVD (PECVD) or high-density plasma CVD (HDP-CVD). In one implementation, contact uniformity support layer 140 can have a thickness of approximately fifty angstroms to approximately one thousand five hundred angstroms (50 Å-1500 Å). By forming contact uniformity support layer 140 as shown in FIG. 4, PCM 110 will remain substantially intact, and uniform contact can be made to PCM 110, as described below. Action 222 is optional in that the inventive concepts of the present application may be implemented without forming contact uniformity support layer 140.

Figure 5:
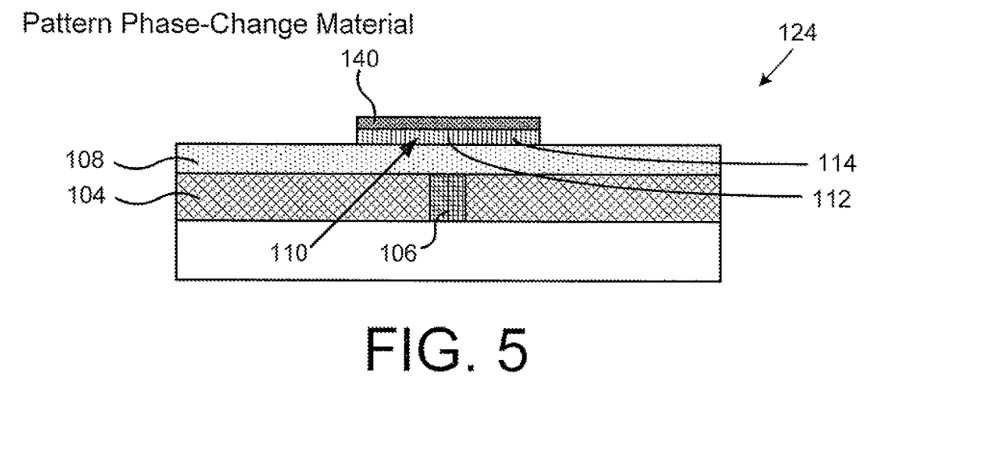

Referring to FIG. 5, PCM RF switch structure 124 illustrates a cross-sectional view of a portion of a PCM RF switch structure processed in accordance with action 224 in the flowchart of FIG. 2 according to one implementation of the present application. As shown in FIG. 5, PCM 110 is patterned. Outer segments of PCM 110 are removed. In the present implementation, outer segments of contact uniformity support layer 140 are also removed. In one implementation, a fluorine-based plasma dry etch is used. In one implementation, thermally conductive and electrically insulating layer 108 performs as an etch stop. By patterning PCM 110 as shown in FIG. 5, a maximum channel size of the PCM RF switch, and a maximum separation of contacts, can be determined. In PCM RF switch structure 124, active segment 112 of PCM 110 overlies heating element 106, and passive segments 114 of PCM 110 partially overlie lower dielectric 104.

Figure 6:
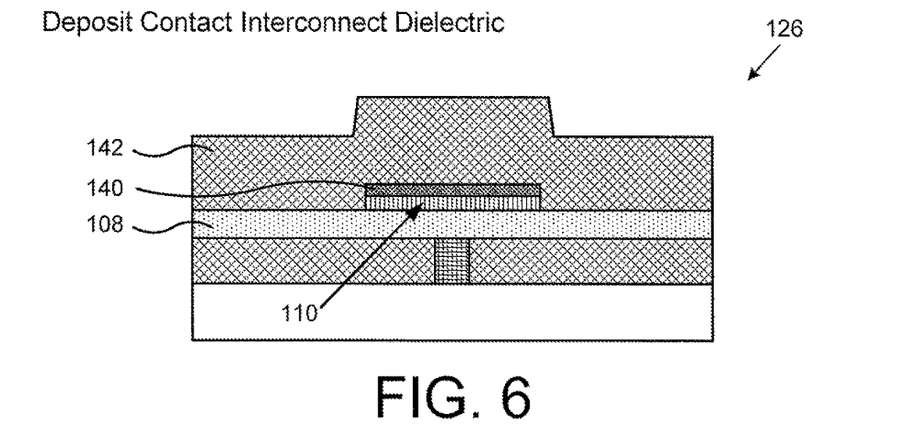

Referring to FIG. 6, PCM RF switch structure 126 illustrates a cross-sectional view of a portion of a PCM RF switch structure processed in accordance with action 226 in the flowchart of FIG. 2 according to one implementation of the present application. As shown in FIG. 6, contact dielectric 142 is formed over PCM 110 and over contact uniformity support layer 140 (in case contact uniformity support layer 140 is used). Notably, contact dielectric 142 is also formed over thermally conductive and electrically insulating layer 108. In various implementations, contact dielectric 142 is $SiO_2$, boron-doped $SiO_2$, phosphorous-doped $SiO_2$, $Si_XN_Y$, or another dielectric. In various implementations, contact dielectric 142 is a low-k dielectric, such as fluorinated silicon dioxide, carbon-doped silicon oxide, or spin-on organic polymer. Contact dielectric 142 can be formed, for example, by PECVD, HDP-CVD, or spin-on processes. The shape and topography of contact dielectric 142 over PCM 110 and over contact uniformity support layer 140 (in case contact uniformity support layer 140 is used) will depend on the formation process used. In one implementation, the deposition thickness of contact dielectric 142 can range from approximately one half a micron to approximately two microns (0.5 μm-2 μm). In other implementations, particularly implementations employing larger devices, the deposition thickness of contact dielectric 142 can be greater. In one implementation, a thickness of contact dielectric 142 is significantly greater than a thickness of thermally conductive and electrically insulating layer 108. In one implementation, a thickness of contact dielectric 142 is significantly greater than a thickness of contact uniformity support layer 140. By forming contact dielectric 142 as shown in FIG. 6, both the thermal performance and the electrical RF performance of a PCM RF switch can be improved, as described below.

Figure 7:
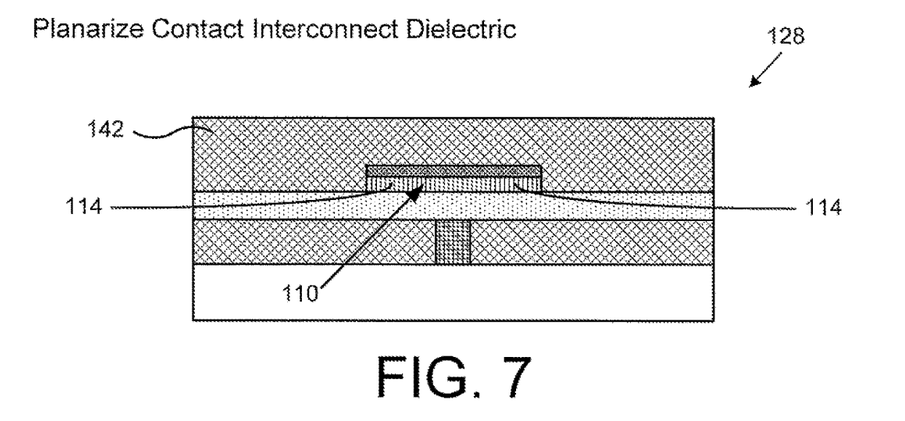

Referring to FIG. 7, PCM RF switch structure 128 illustrates a cross-sectional view of a portion of a PCM RF switch structure processed in accordance with action 228 in the flowchart of FIG. 2 according to one implementation of the present application. As shown in FIG. 7, contact dielectric 142 is planarized. In one implementation, chemical machine polishing (CMP) is used to planarize contact dielectric 142. Planarizing contact dielectric 142 as shown in FIG. 7 allows subsequent masks and subsequent etches to be performed with more reliable alignment, and allows other planar layers to be deposited above PCM RF switch structure 128. Action 228 is optional in that the inventive concepts of the present application may be implemented without planarizing contact dielectric 142. For example, where contact dielectric 142 is a spin-on organic polymer, action 228 can be omitted.

It is noted that, while action 228 results in contact dielectric 142 being substantially planar, contact dielectric 142 may not necessarily have uniform thickness along PCM RF switch structure 128. For example, due to normal process variations associated with planarization, a thickness of contact dielectric 142 overlying one of passive segments 114 of PCM 110 can be less than a thickness of contact dielectric 142 overlying another one of passive segments 114 of PCM 110. In one implementation, an average thickness of contact dielectric 142 overlying PCM 110 is approximately five thousand angstroms (5,000 Å), a thickness of contact dielectric 142 overlying one of passive segments 114 of PCM 110 is approximately three thousand and five hundred angstroms (3,500 Å), and a thickness of contact dielectric 142 overlying another one of passive segments 114 of PCM 110 is approximately six thousand and five hundred angstroms (6,500 Å). In other implementations, contact dielectric 142 can have other thicknesses.

Figure 8:
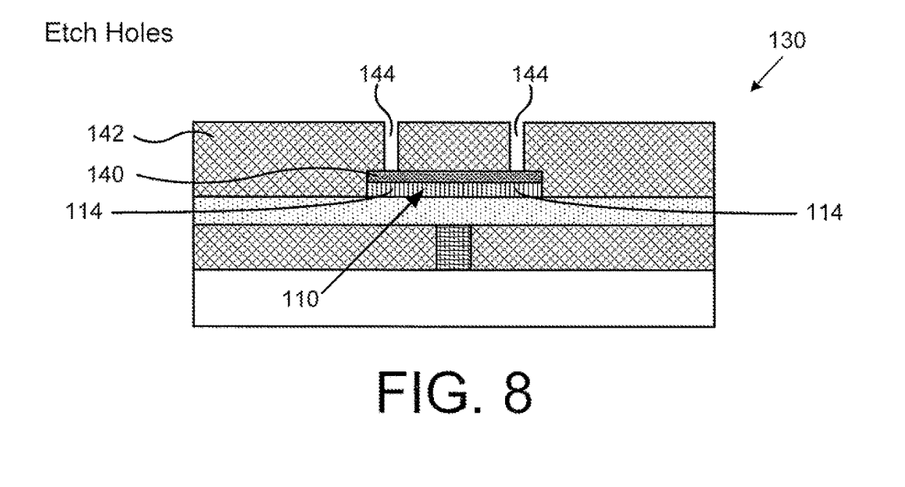

Referring to FIG. 8, PCM RF switch structure 130 illustrates a cross-sectional view of a portion of a PCM RF switch structure processed in accordance with action 230 in the flowchart of FIG. 2 according to one implementation of the present application. As shown in FIG. 8, holes 144 are etched in contact dielectric 142. Holes 144 extend through contact dielectric 142 toward passive segments 114 of PCM 110. In PCM RF switch structure 130, holes 144 stop at contact uniformity support layer 140. In another implementation where contact uniformity support layer 140 is not used, holes 144 can extend to PCM 110. However, it may not be possible to accurately time the etching action to stop precisely at the top surface of PCM 110, especially because contact dielectric 142 can be significantly thicker than PCM 110. For example, fluorine-based etchants that etch through contact dielectric 142 can also etch into PCM 110.

In the present implementation, contact dielectric 142 can be aggressively etched to form holes 144 without having to accurately time the etching action. This etching action can use a selective etch, for example, a fluorine-based plasma dry etch, and contact uniformity support layer 140 can perform as an etch stop while contact dielectric 142 is selectively etched. Etching holes 144 as shown in FIG. 8 enables formation of slot lower portions of PCM contacts, as described below.

Figure 9:
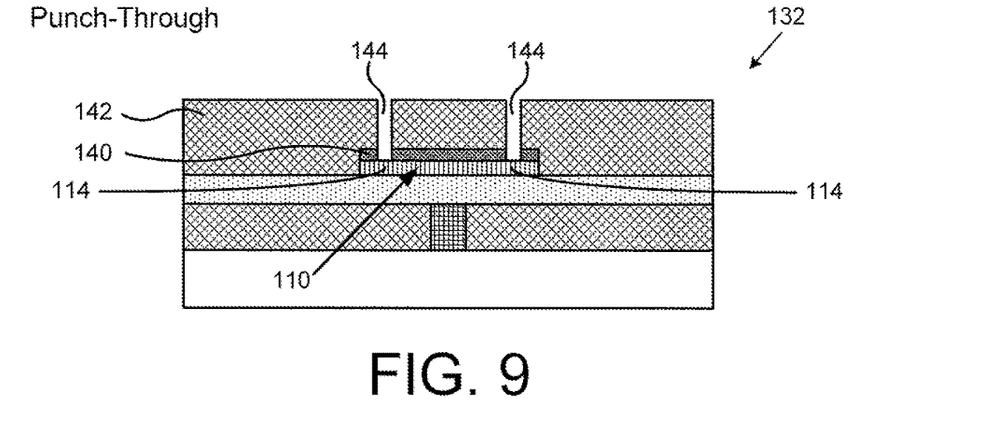

Referring to FIG. 9, PCM RF switch structure 132 illustrates a cross-sectional view of a portion of a PCM RF switch structure processed in accordance with action 232 in the flowchart of FIG. 2 according to one implementation of the present application. As shown in FIG. 9, contact uniformity support layer 140 is punch-through etched in holes 144. Holes 144 extend through contact dielectric 142 and through contact uniformity support layer 140, and connect to passive segments 114 of PCM 110. As used herein, "punch-through" refers to a short etching action that can be accurately timed to stop at the top surface of PCM 110. In PCM RF switch structure 132, holes 144 are narrow and contact uniformity support layer 140 is thin. Thus, only a small volume of contact uniformity support layer 140 is etched in holes 144, and the punch-through etching action is short and can be accurately timed. In one implementation, a chlorine-based plasma dry etch is used. In another implementation, a fluorine-based plasma dry etch is used. In this implementation, the fluorine-based plasma dry etch used to punch-through etch contact uniformity support layer 140 in FIG. 9 can have an etch chemistry different from that of the fluorine-based plasma dry etch used to etch contact dielectric 142 in FIG. 8. Action 232 is optional in that, where contact uniformity support layer 140 is not used, a punch-through etch is likewise not used, and holes 144 can extend through contact dielectric 142 into PCM 110.

Figure 10:
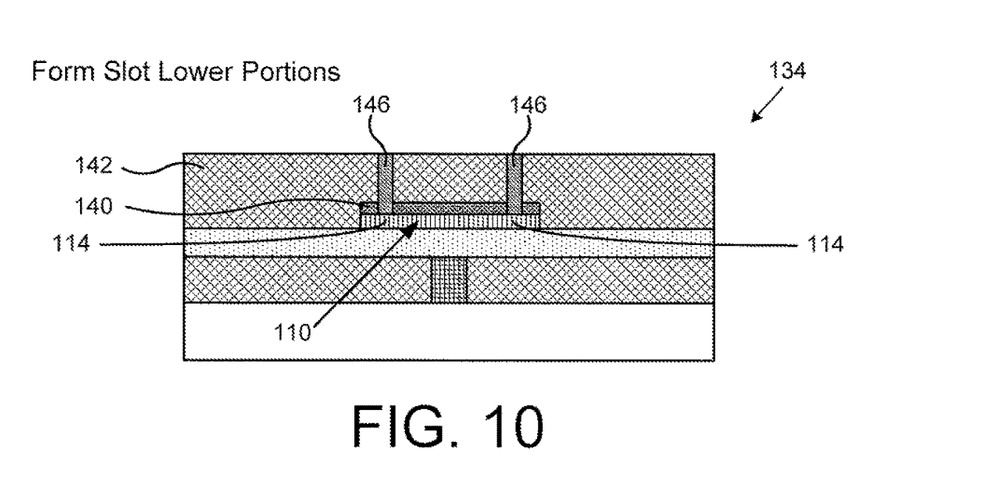

Referring to FIG. 10, PCM RF switch structure 134 illustrates a cross-sectional view of a portion of a PCM RF switch structure processed in accordance with action 234 in the flowchart of FIG. 2 according to one implementation of the present application. As shown in FIG. 10, slot lower portions 146 are formed in holes 144 (shown in FIG. 9). Slot lower portions 146 extend through contact dielectric and through contact uniformity support layer 140 (in case contact uniformity support layer 140 is used), and connect to passive segments 114 of PCM 110. Notably, slot lower portions 146 are narrow and connect to the top of PCM 110, not to the sidewalls of PCM 110. In one implementation, a metal layer is deposited in holes 144 (shown in FIG. 9) and over contact dielectric 142, and then planarized with contact dielectric 142, for example, using CMP, thereby forming slot lower portions 146. In an alternative implementation, a single damascene process is used to form slot lower portions 146. In various implementations, slot lower portions 146 can comprise W, Al, or Cu. Slot lower portions 146 are part of PCM contacts 150 (shown in FIG. 11) that provide RF signals to and from PCM 110. By forming slot lower portions 146 as shown in FIG. 10, both the thermal performance and the RF performance of a PCM RF switch is improved, as described below.

Figure 11:
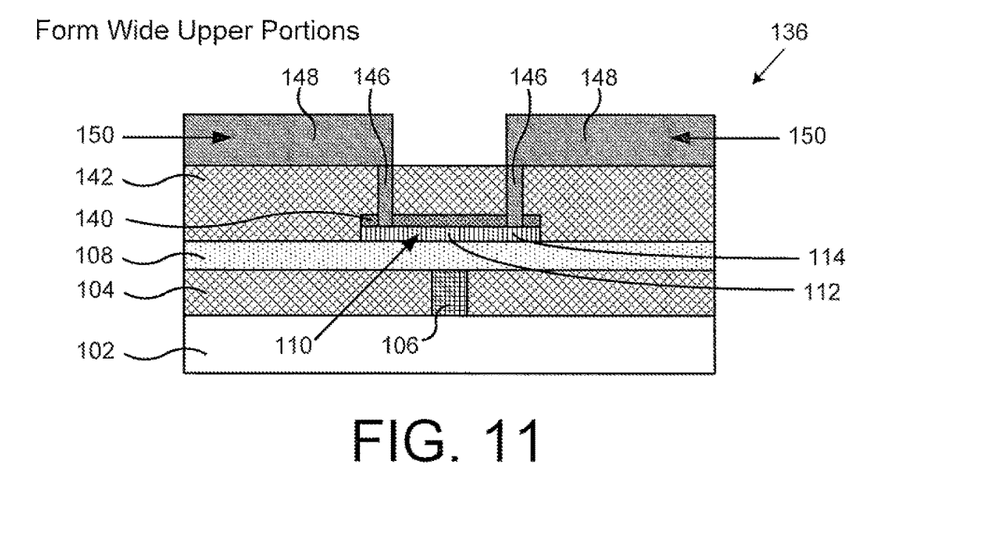

Referring to FIG. 11, PCM RP switch structure 136 illustrates a cross-sectional view of a portion of a PCM RF switch structure processed in accordance with action 236 in the flowchart of FIG. 2 according to one implementation of the present application. As shown in FIG. 11, PCM RF switch structure 136 includes substrate 102, lower dielectric 104, heating element 106, thermally conductive and electrically insulating layer 108, PCM 110 having active segment 112 and passive segments 114, contact uniformity support layer 140, contact dielectric 142, and PCM contacts 150 having slot lower portions 146 and wide upper portions 148.

Figure 12A:
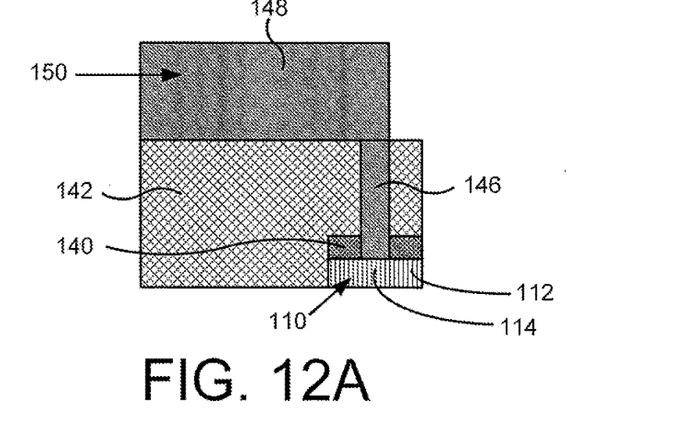
FIGS. 12A through 12C each illustrate a close-up cross-sectional view of PCM contacts according various implementations of the present application.

Wide upper portions 148 are formed over contact dielectric 142 and over slot lower portions 146. Together, slot lower portions 146 and wide upper portions 148 make up PCM contacts 150 that provide RF signals to and from PCM 110. Wide upper portions 148 facilitate external connections for a PCM RF switch and also improve signal handling. In one implementation, a metal layer is deposited over contact dielectric 142 and over slot lower portions 146, and then a middle segment thereof overlying active segment 112 is etched, thereby forming wide upper portions 148. In an alternative implementation, a single damascene process is used to form wide upper portions 148. FIG. 12A illustrates a close-up cross-sectional view of slot lower portions 146 and wide upper portions 148 formed using either of these alternate implementations. In various implementations, wide upper portions 148 can comprise W, Al, or Cu. In one implementation, slot lower portions 146 can comprise W, and wide upper portions 148 can comprise Al or Cu.

Figure 12B:
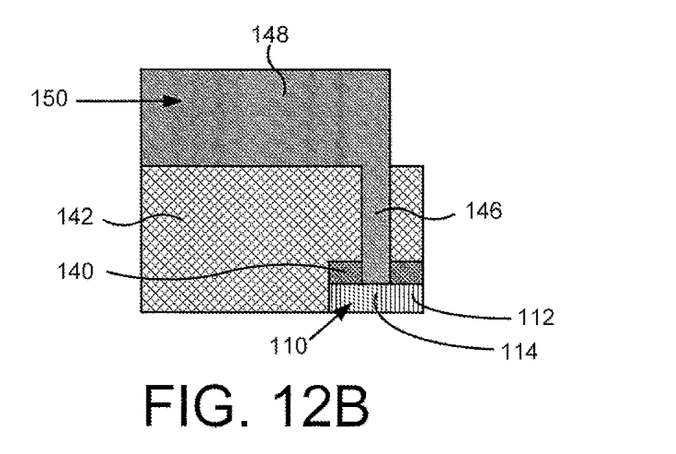
Figure 12C:
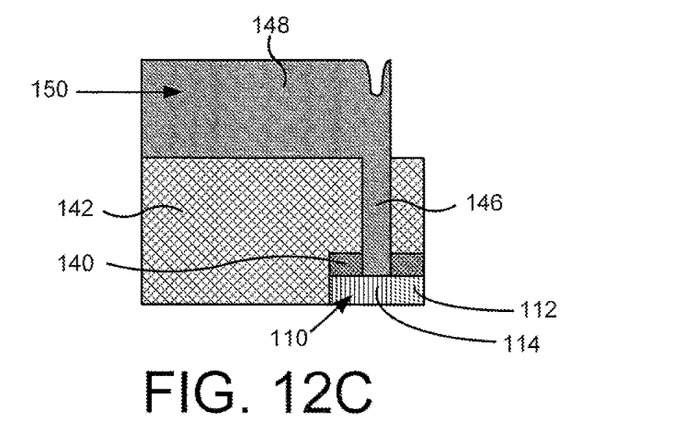

Although slot lower portions 146 and wide upper portions 148 are separate formations in FIG. 12A, in other implementations they may be parts of the same formation. For example, FIG. 12B illustrates a close-up cross-sectional view of slot lower portions 146 and wide upper portions 148 formed as a single metal using a dual damascene process. As another example, FIG. 12C illustrates a close-up cross-sectional view of slot lower portions 146 and wide upper portions 148 formed as a single metal by depositing a metal layer in holes 144 (shown in FIG. 9) and over contact dielectric 142, and then etching a middle segment thereof overlying active segment 112. Notably, in FIGS. 12B and 12C, slot lower portions 146 and wide upper portions 148 do not have a boundary interface. Although slot lower portions 146 and wide upper portions 148 are aligned in FIGS. 11, 12A, 12B, and 12C, in various implementations, wide upper portions 148 can have an offset towards active segment 112 of PCM 110 or can have an offset away from active segment 112 of PCM 110.

By utilizing the methods and structures disclosed in the present application, a PCM RF switch with improved thermal and electrical RF performance can be reliably manufactured. The methods and structures disclosed in the present application are compatible with CMOS processes and no specialty manufacturing is required. Compared to PCM contacts 116 in FIG. 1, PCM contacts 150 in FIG. 11 have significantly reduced parasitic capacitance. Because contact dielectric 142 is situated over thermally conductive and electrically insulating layer 108, the wide bottom surface areas of wide upper portions 148 have increased separation from heating element 106, and parasitic capacitance is reduced. Slot lower portions 146 of PCM contacts 150 provide RF signals between wide upper portions 148 of PCM contacts 150 and PCM 110. Because slot lower portions 146 of PCM contacts 150 are narrow, the values of parasitic capacitors formed between them and heating element 106 are minimized and may be negligible, and the total parasitic capacitance between the PCM contacts and the heating element is further reduced. In one implementation, parasitic capacitance of PCM RF switch structure 100 in FIG. 1 is approximately ten femto-Farads (10 fF), while parasitic capacitance of PCM RF switch structure 136 in FIG. 11 is approximately between a half of a femto-Farad and two femto-Farads (0.5 fF-2.0 fF).

Additionally, because contact dielectric 142 is a distinct electrically insulating structure from thermally conductive and electrically insulating layer 108, the present methods and structures enable control over a critical design dimension. Although the thickness of thermally conductive and electrically insulating layer 108 can be increased in order to reduce parasitic capacitance, doing so would detrimentally reduce heat transfer from heating element 106 to active segment 112 of PCM 110, and thus increase the power required to switch between ON and OFF states. In contrast, the thickness of contact dielectric 142 can be increased in order to reduce parasitic capacitance, without impacting heat transfer from heating element 106 to active segment 112 of PCM 110. Moreover, because contact dielectric 142 adjoins the sidewalls of PCM 110 and narrow slot lower portions 146 connect to the top of PCM 110, PCM contacts 150 do not sink significant amounts of heat from PCM 110. Less heat is required from heating element 106 in order to transform active segment 112 of PCM 110, and thus less power is required to switch between ON and OFF states.

As described above, the thickness of contact dielectric 142 can be increased in order to reduce parasitic capacitance. During formation of slot lower portions 146 of PCM contacts 150, thick contact dielectric 142 can be aggressively etched without etching PCM 110, since contact uniformity support layer 140 performs as an etch stop. Because slot lower portions 146 are narrow and contact uniformity support layer 140 is thin, contact uniformity support layer 140 can be punch-through etched such that holes 144 (shown in FIG. 9) stop at PCM 110, with minimal or substantially no etching of PCM 110. Passive segments 114 of PCM 110 maintain a substantially constant thickness, and slot lower portions 146 uniformly contact passive segments 114 of PCM 110. Because the ON state resistance ($R_{ON}$) of a PCM RF switch depends heavily on the uniformity of a contact made between PCM contacts 150 and PCM 110, the $R_{ON}$ will be significantly lower when contact uniformity support layer 140 is used.

Even where minimal etching of PCM 110 occurs, such minimal etching will be uniform for both of passive segments 114. Because contact uniformity support layer 140 performs as an etch stop, the thickness of passive segments 114 will be governed by the punch-through etch (shown in FIG. 9). Thus, regardless of variations in the thickness of contact dielectric 142 across PCM RF switch structure 136, neither passive segment 114 will be etched substantially more than the other. Accordingly, contact uniformity support layer 140 accounts for normal process variations associated with planarization.

Further, contact uniformity support layer 140 protects PCM 110 from atmospheric effects, such as oxidation and humidity, during the formation of PCM contacts 150. Because contact uniformity support layer 140 is formed immediately after PCM 110, and removed immediately before slot lower portions 146 of PCM contacts 150 are formed, the amount of time PCM 110 is exposed to atmospheric effects is minimized. Notably, action 230 of etching holes 144 in contact dielectric 142 (shown in FIG. 9) may require a long etch time due to the thickness of contact dielectric 142. Contact uniformity support layer 140 protects PCM 110 from atmospheric effects during this long etch time.

Thus, various implementations of the present application achieve a method of manufacturing and a structure a PCM RF switch that overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method for fabricating contacts in an RF switch comprising a phase-change material (PCM) and a heating element approximately underlying an active segment of said PCM, the method comprising:
   forming a contact uniformity support layer over said PCM;
   patterning said PCM and said contact uniformity support layer;
   forming a contact dielectric over said contact uniformity support layer;
   forming slot lower portions of PCM contacts extending through said contact dielectric and through said contact uniformity support layer, and connected to passive segments of said PCM;
   forming wide upper portions of said PCM contacts over said contact dielectric and over said slot lower portions of said PCM contacts;
   wherein said contact dielectric separates said wide upper portion of said PCM contacts from said heating element so as to reduce a parasitic capacitance of said RF switch.

2. The method of claim 1, wherein said contact uniformity support layer maintains a substantially constant thickness of said passive segments of said PCM.

3. The method of claim 1, wherein said forming said slot lower portions of said PCM contacts comprises a punch-through etch of said contact uniformity support layer.

4. The method of claim 1, wherein said contact uniformity support layer is formed immediately after said PCM is formed so as to protect said PCM from atmospheric effects.

5. The method of claim 1, wherein said contact uniformity support layer comprises nitride.

6. The method of claim 1, wherein said contact uniformity support layer is a bi-layer that comprises oxide and nitride.

7. The method of claim 1, wherein said contact dielectric is further situated on sidewalls of said PCM.

8. The method of claim 1, wherein a thermally conductive and electrically insulating layer is situated under said PCM, and a thickness of said contact dielectric is significantly greater than a thickness of said thermally conductive and electrically insulating layer.

9. The method of claim 1, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

10. The method of claim 1, wherein said contact dielectric comprises a material selected from the group consisting of $SiO_2$, boron-doped $SiO_2$, phosphorous-doped $SiO_2$ and $Si_XN_Y$.

11. The method of claim 8, wherein said thermally conductive and electrically insulating layer comprises a material selected from the group consisting of aluminum nitride (AlN), aluminum oxide ($Al_XO_Y$), beryllium oxide ($Be_XO_Y$), silicon carbide (SiC), diamond, and diamond-like carbon.

12. A method for fabricating contacts in an RF switch comprising a phase-change material (PCM) and a heating element approximately underlying an active segment of said PCM, the method comprising:
   forming a contact dielectric over said PCM
   forming slot lower portions of PCM contacts extending through said contact dielectric and connecting to passive segments of said PCM;
   forming wide upper portions of said PCM contacts over said contact dielectric and over said slot lower portions of said PCM contacts.

13. The method of claim 12, wherein said contact dielectric is further situated on sidewalls of said PCM.

14. The method of claim 12, wherein said contact dielectric comprises a material selected from the group consisting of $SiO_2$, boron-doped $SiO_2$, phosphorous-doped $SiO_2$ and $Si_XN_Y$.

15. The method of claim 12, wherein a thermally conductive and electrically insulating layer is situated under said PCM.

16. The method of claim 15, wherein said thermally conductive and electrically insulating layer comprises a material selected from the group consisting of aluminum nitride (AlN), aluminum oxide ($Al_XO_Y$), beryllium oxide ($Be_XO_Y$), silicon carbide (SiC), diamond, and diamond-like carbon.

17. The method of claim 12, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

18. A method for fabricating contacts in an RF switch comprising a phase-change material (PCM) and a heating element approximately underlying an active segment of said PCM, the method comprising:
   forming a contact uniformity support layer over said PCM;
   forming a contact dielectric over said contact uniformity support layer;
   forming slot lower portions of PCM contacts extending through said contact dielectric and through said contact uniformity support layer, and connected to passive segments of said PCM.

19. The method of claim 18, wherein said contact uniformity support layer comprises nitride.

20. The method of claim 18, wherein said contact uniformity support layer is a bi-layer that comprises oxide and nitride.

* * * * *